(12) United States Patent
Kondo et al.

(10) Patent No.: US 11,920,072 B2
(45) Date of Patent: Mar. 5, 2024

(54) METHOD FOR PRODUCING RARE EARTH ALUMINATE SINTERED BODY

(71) Applicant: NICHIA CORPORATION, Anan (JP)

(72) Inventors: Masaki Kondo, Tokushima (JP); Shozo Taketomi, Toskushima (JP); Hirofumi Oguri, Komatsushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/845,807

(22) Filed: Apr. 10, 2020

(65) Prior Publication Data
US 2020/0324342 A1    Oct. 15, 2020

(30) Foreign Application Priority Data

Apr. 11, 2019  (JP) ................. 2019-075690
Jul. 12, 2019  (JP) ................. 2019-130523

(51) Int. Cl.
| C09K 11/77 | (2006.01) |
| B22F 1/142 | (2022.01) |
| B22F 7/00 | (2006.01) |
| C01F 17/34 | (2020.01) |
| C04B 35/117 | (2006.01) |
(Continued)

(52) U.S. Cl.
CPC .......... *C09K 11/7774* (2013.01); *B22F 1/142* (2022.01); *B22F 7/008* (2013.01); *C01F 17/34* (2020.01); *C04B 35/117* (2013.01); *C04B 35/44* (2013.01); *C04B 35/64* (2013.01); *C09K 11/02* (2013.01); *G03B 21/204* (2013.01); *H01L 33/502* (2013.01); *B22F 2201/03* (2013.01); *B22F 2301/45* (2013.01); *B22F 2302/25* (2013.01); *B22F 2303/01* (2013.01); *B22F 2304/10* (2013.01); *C04B 35/62685* (2013.01); *C04B 2235/3224* (2013.01); *C04B 2235/3229* (2013.01); *C04B 2235/5436* (2013.01); *C04B 2235/5445* (2013.01); *C09K 11/0838* (2013.01)

(58) Field of Classification Search
CPC ........................ C09K 11/7774; C09K 11/7766
See application file for complete search history.

(56) References Cited

U.S. PATENT DOCUMENTS

| 8,445,931 B2 | 5/2013 | Wataya et al. |
| 8,937,286 B2 | 1/2015 | Morimoto et al. |

(Continued)

FOREIGN PATENT DOCUMENTS

| CN | 108947516 A | * 12/2018 |
| JP | 2009530839 A | 8/2009 |

(Continued)

*Primary Examiner* — Alexandra M Moore
*Assistant Examiner* — Austin Pollock
(74) *Attorney, Agent, or Firm* — Hunton Andrews Kurth LLP

(57) ABSTRACT

A method for producing a rare earth aluminate sintered body includes: preparing a molded body by mixing a fluorescent material having a composition of a rare earth aluminate and a raw material mixture comprising an oxide containing at least one rare earth element Ln selected from the group consisting of Y, La, Lu, Gd, and Tb, an oxide containing Ce, an oxide containing Al, and optionally an oxide containing at least one element $M^1$ selected from the group consisting of Ga and Sc; and calcining the molded body to obtain a sintered body.

7 Claims, 10 Drawing Sheets

(51) Int. Cl.
  *C04B 35/44*    (2006.01)
  *C04B 35/626*   (2006.01)
  *C04B 35/64*    (2006.01)
  *C09K 11/02*    (2006.01)
  *C09K 11/08*    (2006.01)
  *G03B 21/20*    (2006.01)
  *H01L 33/50*    (2010.01)

(56) References Cited

U.S. PATENT DOCUMENTS

| | | | |
|---|---|---|---|
| 11,427,511 B2 | 8/2022 | Menke et al. | |
| 2006/0124951 A1* | 6/2006 | Sakata | C04B 35/44 |
| | | | 257/99 |
| 2009/0072700 A1* | 3/2009 | Kameshima | C09K 11/7774 |
| | | | 313/483 |
| 2009/0105065 A1 | 4/2009 | Bechtel et al. | |
| 2011/0272725 A1 | 11/2011 | Wataya et al. | |
| 2013/0002129 A1* | 1/2013 | Zheng | C09K 11/7774 |
| | | | 313/503 |
| 2014/0246586 A1 | 9/2014 | Morimoto et al. | |
| 2015/0069299 A1 | 3/2015 | Pan et al. | |
| 2015/0144978 A1 | 5/2015 | Miyagawa et al. | |
| 2015/0329778 A1 | 11/2015 | Menke et al. | |
| 2017/0342322 A1* | 11/2017 | Suzuki | C09K 11/7774 |
| 2019/0185744 A1 | 6/2019 | Takahashi et al. | |
| 2020/0144789 A1 | 5/2020 | Oshio et al. | |
| 2022/0371961 A1 | 11/2022 | Menke et al. | |

FOREIGN PATENT DOCUMENTS

| | | | | |
|---|---|---|---|---|
| JP | 2009215495 A | | 9/2009 | |
| JP | 2011256371 A | | 12/2011 | |
| JP | 2012052061 A | | 3/2012 | |
| JP | 2014181288 A | | 9/2014 | |
| JP | 2014221706 A | * | 11/2014 | |
| JP | 2014221706 A | | 11/2014 | |
| JP | 2016509103 A | | 3/2016 | |
| JP | 2016176007 A | * | 10/2016 | ........... C04B 35/115 |
| JP | 2016204563 A | * | 12/2016 | |
| JP | 2017197774 A | | 11/2017 | |
| JP | 2018172628 A | | 11/2018 | |
| WO | 2013065605 A1 | | 5/2013 | |
| WO | WO-2016114481 A1 | * | 7/2016 | ............... C03C 4/12 |
| WO | 2018038259 A1 | | 3/2018 | |
| WO | WO-2018205710 A1 | * | 11/2018 | ............. C04B 35/10 |
| WO | 2018225424 A1 | | 12/2018 | |

* cited by examiner

METHOD FOR PRODUCING RARE EARTH ALUMINATE SINTERED BODY

CROSS-REFERENCE TO RELATED PATENT APPLICATION

This application claims priority to Japanese Patent Application No. 2019-075690, filed on Apr. 11, 2019, and Japanese Patent Application No. 2019-130523, filed on Jul. 12, 2019, the entire disclosures of which are hereby incorporated by references in their entirety.

BACKGROUND

Technical Field

The present disclosure relates to a method for producing a rare earth aluminate sintered body.

Description of Related Art

A light emitting device, including a light emitting diode (hereinafter also referred to as "LED") or a laser diode (hereinafter also referred to as "LD") and a wavelength conversion member containing a fluorescent material that converts a wavelength of light emitted from the LED or LD, is known. Such a light emitting device is being utilized, for example, in a light source for vehicles, general lighting, backlights of liquid crystal display devices, projectors. In this specification, the "fluorescent material" is used in the same meaning as a "fluorescent phosphor".

As a wavelength conversion member included in a light emitting device, for example, Japanese Unexamined Patent Publication No. 2017-197774 discloses a single-phase ceramic conversion member obtained by sintering a green molded body formed by molding oxide starting raw materials having a particle diameter of less than 1 μm in primary particles.

In the single-phase ceramic conversion member of Japanese Unexamined Patent Publication No. 2017-197774, the density and the porosity of the sintered body are adjusted by sintering starting raw materials in which the particle diameter of the primary particles is adjusted, to enhance light diffusing. However, there has been a demand for further improving luminous efficiency. In addition, when a ceramic conversion member is used, for example, in a laser light source, it may be required to reduce the spread of light emitted from the same surface as that on which excitation light is incident, to converge the light on a desired position.

Thus, an embodiment of the present disclosure has an object to provide a method for producing a rare earth aluminate sintered body having high luminous efficiency.

SUMMARY

A first embodiment of the present disclosure relates to a method for producing a rare earth aluminate sintered body including: preparing a molded body by mixing a fluorescent material having a composition of a rare earth aluminate and a raw material mixture comprising an oxide containing at least one rare earth element Ln selected from the group consisting of Y, La, Lu, Gd, and Tb, an oxide containing Ce, an oxide containing Al, and optionally an oxide containing at least one element $M^1$ selected from the group consisting of Ga and Sc; and calcining the molded body to obtain a sintered body.

A second embodiment of the present disclosure relates to a method for producing a rare earth aluminate sintered body including: preparing a molded body by mixing a first fluorescent material having a first composition of a first rare earth aluminate and having an average particle diameter in a range of 0.3 μm or more and 1.0 μm or less, as measured according to a Fisher Sub-Sieve Sizer method, and a second fluorescent material having a second composition of a second rare earth aluminate and having an average particle diameter in a range of 1.1 μm or more and 10 μm or less, as measured according to the Fisher Sub-Sieve Sizer method; and calcining the molded body to obtain a sintered body.

In accordance with the embodiments of the present disclosure, a method for producing a rare earth aluminate sintered body having high luminous efficiency can be provided.

DETAILED DESCRIPTION

Figure 1:
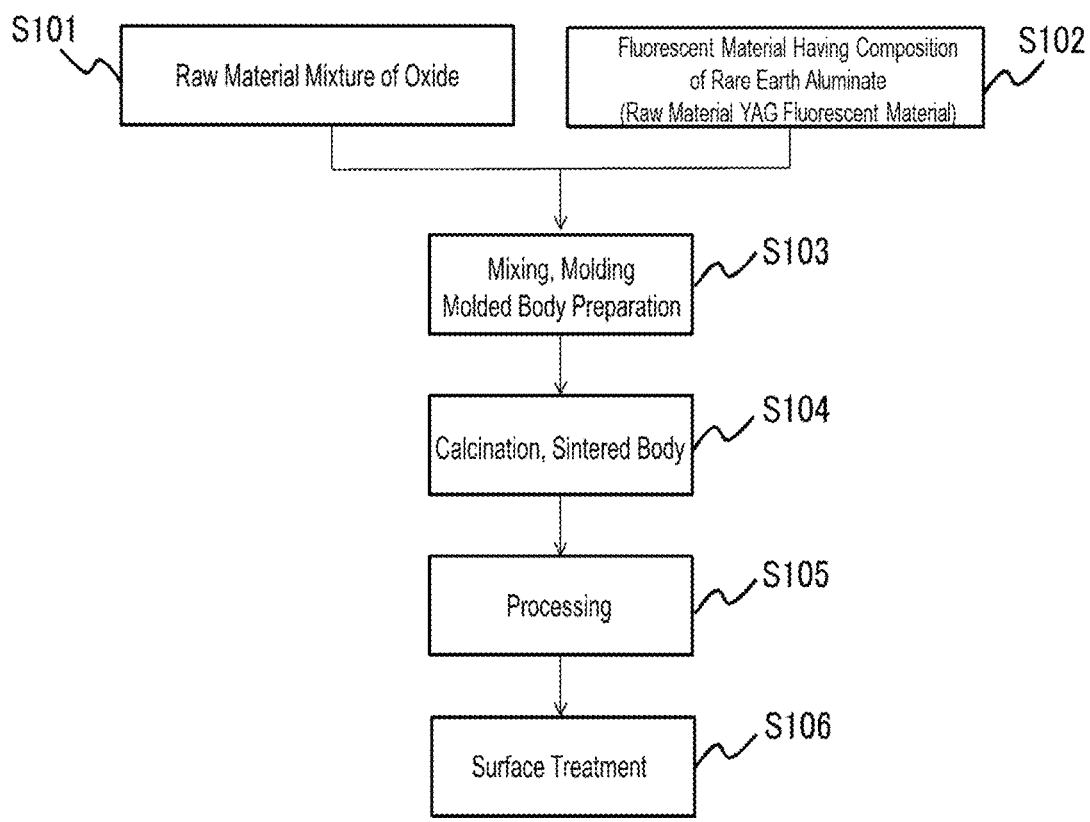
FIG. 1 is a flowchart describing a method for producing a rare earth aluminate sintered body according to the first embodiment of the present disclosure.

The method for producing a rare earth aluminate sintered body according to the present disclosure will be hereunder described on the basis of embodiments. The embodiments described below are exemplifications for embodying the technical idea of the present disclosure, and the present disclosure is not limited to the following method for producing a rare earth aluminate sintered body. Standards according to Japanese Industrial Standard (JIS) Z8110 are applied to the relations between color names and chromaticity coordinates, and the relations between wavelength ranges of light and color names of monochromatic lights.

Rare Earth Aluminate Sintered Body Production Method 1

The method for producing a rare earth aluminate sintered body according to the first embodiment includes: preparing a molded body by mixing a fluorescent material (hereinafter also referred to as "raw material YAG fluorescent material") having a composition of a rare earth aluminate and a raw material mixture comprising an oxide containing at least one rare earth element Ln selected from the group consisting of Y, La, Lu, Gd, and Tb, an oxide containing Ce, an oxide containing Al, and optionally an oxide containing at least one element $M^1$ selected from the group consisting of Ga and Sc; and calcining the molded body to obtain a sintered body.

The raw material YAG fluorescent material and the raw material mixture form a crystal phase of a fluorescent material having a composition of a rare earth aluminate, since the crystal grows by calcining and the both contain Ce as an activation element. The obtained rare earth aluminate sintered body has an oxide growth crystal phase in which the oxide in the raw material mixture forms a crystal and the crystal grows, and a fluorescent material growth crystal phase in which the crystal in the raw material YAG fluorescent material grows. The oxide growth crystal phase and the fluorescent material growth crystal phase constitute a sintered body in a state where the respective grain boundaries are in close contact. It is presumed that the crystal growth rate is different between the oxide growth crystal phase formed from the oxide contained in the raw material mixture and the fluorescent material growth crystal phase in which the crystal of the raw material YAG fluorescent material grows. Therefore, voids are formed around the crystal phases of the rare earth aluminate sintered body due to a difference in growth rate of each crystal. The rare earth aluminate sintered body contains voids that are dispersed around the crystal phases, and thus the incident light is efficiently diffused by the voids to efficiently convert the wavelength by the crystal phases adjacent to the voids. When the rare earth aluminate sintered body is formed into a plate shape, light having high wavelength conversion efficiency and high luminous flux can be emitted from the same surface as that on which the excitation light is incident.

Further, the rare earth aluminate sintered body preferably has two kinds of crystal phases having different circle-equivalent particle diameters. Thereby, the light is irregularly reflected even between the crystal phases to convert the wavelength of the excitation light, and thus, when the wavelength-converted light is emitted from the same surface as that on which the excitation light is incident, the spread of the light is suppressed, and the emitting light converged on a desired position can be emitted.

The oxide growth crystal phase and the fluorescent material growth crystal phase contained in the rare earth aluminate sintered body are different in size of the crystal phase. However, since the grown crystal phase has the same composition of the rare earth aluminate, it is difficult to estimate the origin of the raw material of the crystal phase whether it is an oxide growth crystal phase or a fluorescent material growth crystal phase. In the present specification, the crystal phase contained in the rare earth aluminate sintered body is referred to as a crystal phase having a composition of a rare earth aluminate without distinguishing between the oxide growth crystal phase and the fluorescent material growth crystal phase.

FIG. 1 is a flowchart describing an example of the method for producing a rare earth aluminate sintered body according to the first embodiment. The steps of the method for producing a rare earth aluminate sintered body according to the first embodiment will be described with reference to FIG. 1. The method for producing a rare earth aluminate sintered body includes a step S103 of preparing a molded body by mixing a raw material YAG fluorescent material and a raw material mixture containing oxides, and a step S104 of calcining the molded body to obtain a sintered body. The method for producing a rare earth aluminate sintered body may include a step S101 of preparing a raw material mixture containing oxides and a step S102 of preparing a fluorescent material (raw material YAG fluorescent material) having a composition of a rare earth aluminate prior to the step S103 of preparing a molded body. After the step S104 of obtaining a sintered body, the method for producing a rare earth aluminate sintered body according to the first embodiment may include a step S105 of processing the resulting sintered body by cutting into a desired size or thickness, and may further include a step S106 of subjecting the sintered body to a surface treatment.

Fluorescent Material Having Composition of Rare Earth Aluminate

The raw material YAG fluorescent material, which is one of the raw materials of the sintered body, preferably has an average particle diameter in a range of 0.3 µm or more and 10 µm or less; and may be in a range of 0.3 µm or more and 9 µm or less, may be in a range of 0.4 µm or more and 8 µm or less, and may be in a range of 0.5 µm or more and 8 µm or less. When the average particle diameter of the raw material YAG fluorescent material falls within a range of 0.3 µm or more and 10 µm or less, an oxide growth crystal phase that is grown from the oxide in the raw material mixture and a fluorescent material growth crystal phase are generated, and due to a difference in growth rate between the crystal phases of the oxide growth crystal phase and the fluorescent material growth crystal phase, a sintered body in which voids for diffusing incident light are formed around the crystal phases can be obtained. Further, when the average particle diameter of the raw material YAG fluorescent material falls within a range of 0.3 µm or more and 10 µm or less, a crystal phase having a circle-equivalent average particle diameter in a range of 0.3 µm or more and 10 µm or less is contained, and the wavelength of incident light diffused by the voids present around the crystal phases is efficiently converted by the crystal phases, so that the wavelength-converted light having high luminous efficiency can be emitted from the same surface as that on which the incident light is incident. In the present specification, the average particle diameter refers to an average particle diameter (Fisher Sub-Sieve Sizer's number) measured according to a Fisher Sub-Sieve Sizer method (hereinafter also referred to as "FSSS method") in which, by using a Fisher Sub-Sieve Sizer Model 95 (manufactured by Fisher Scientific Inc.) under an environment of a temperature of 25° C. and a humidity of 70% RH, 1 cm$^3$ of each sample (fluorescent material and each oxide raw material) is weighed and packed in a dedicated tubular container, followed by flowing dry air at a constant pressure, and the specific surface area is read from the differential pressure.

Raw Material Mixture

The average particle diameter of each of the oxide containing the rare earth element Ln, the oxide containing Ce, the oxide containing Al, and optionally the oxide containing the element $M^1$ contained in the raw material mixture is preferably in a range of 0.01 µm or more and 1.5 µm or less, more preferably in a range of 0.02 µm or more and 1.0 µm or less, even more preferably in a range of 0.02 µm or more and 0.7 µm or less. When the average particle diameter of each oxide contained in the raw material mixture falls within a range of 0.01 µm or more and 1.5 µm or less, an oxide growth crystal phase having a size different from that of a fluorescent material growth crystal phase in which the raw material YAG fluorescent material or a crystal of the raw material YAG fluorescent material is grown is formed in the rare earth aluminate sintered body. Voids are formed around these crystal phases due to a difference in crystal growth rate between each oxide and the raw material YAG fluorescent material. The size of the voids in the rare earth aluminate sintered body tends to depend on the size of the particle diameter of each oxide in the raw material mixture. When an oxide having a relatively small particle diameter, in which the average particle diameter of the oxide in the raw material mixture is in a range of 0.01 µm or more and 1.5 µm or less, is used, relatively small voids are uniformly distributed and formed around the crystal phases, so that a sintered body having enhanced diffusing properties of incident light can be obtained. It is presumed that the size of the voids contained in the sintered body tends to depend on the size of the particle diameter of each oxide in the raw material mixture having a melting point close to the calcining temperature. It is presumed that the size of the voids contained in the sintered body tends to depend on the size of the particle diameter of the oxide containing a rare earth element Ln among the oxides in the raw material mixture. For example, the melting point of the oxide containing at least one rare earth element Ln selected from the group consisting of Y, La, Lu, Gd, and Tb is in a range of 2,100° C. or more and 2,500° C. or less. In the case of obtaining a sintered body containing a large number of small voids, the average particle diameter of the oxide containing a rare earth element Ln is preferably in a range of 0.01 µm or more and 1.0 µm or less, more preferably in a range of 0.01 µm or more and 0.8 µm or less. In the oxides other than the oxide containing a rare earth element Ln such as the oxide containing Al and the oxide containing Ga, and the oxides containing rare earth elements other than the rare earth element Ln such as the oxide containing Sc and the oxide containing Ce, the average particle diameter thereof may be larger than that of the oxide containing a rare earth element Ln. The average particle diameter of each of the oxide containing Al, the oxide containing Ce, and optionally the oxide containing an element $M^1$ may be in a range of more than 0.8 µm and 1.5 µm or less, and may be in a range of 0.9 µm or more and 1.0 µm or less.

Specific examples of the oxide contained in the raw material mixture may include $Y_2O_3$, $La_2O_3$, $Lu_2O_3$, $Gd_2O_3$, $Tb_2O_3$, $CeO_2$, $Al_2O_3$, $Ga_2O_3$, and $Sc_2O_3$. It is preferred that the oxides contained in the raw material mixture are mixed so as to have a molar ratio to be the aforementioned composition of the rare earth aluminate, or to have a molar ratio to be the composition represented by a formula (I) described below.

Mass Ratio of Raw Material YAG Fluorescent Material

In the step of mixing and molding the raw material YAG fluorescent material and the raw material mixture to obtain a molded body, the mass ratio of the raw material YAG fluorescent material in the molded body is preferably in a range of 10% by mass or more and 90% by mass or less, more preferably in a range of 20% by mass or more and 80% by mass or less, even more preferably in a range of 30% by mass or more and 70% by mass or less, relative to 100% by mass of the total amount of the raw material YAG fluorescent material and the raw material mixture. When the mass ratio of the raw material YAG fluorescent material falls within a range of 10% by mass or more and 90% by mass or less relative to 100% by mass of the total amount of the raw material YAG fluorescent material and the raw material mixture, two crystal phases having different sizes, that is, a first crystal phase having a circle-equivalent particle diameter in a range of 0.1 µm or more and 1.0 µm or less and a second crystal phase having a circle-equivalent particle diameter in a range of 1.1 µm or more and 15 µm or less are generated, and a sintered body in which voids are formed around the crystal phases due to a difference in growth rate of the crystal phases can be obtained. The step of preparing a molded body and the step of calcining the molded body to obtain a sintered body will be described below.

Rare Earth Aluminate Sintered Body Production Method 2

The method for producing a rare earth aluminate sintered body according to the second embodiment includes: preparing a molded body by mixing a first fluorescent material (hereinafter also referred to as "first raw material YAG fluorescent material") having a first composition of a first rare earth aluminate and having an average particle diameter in a range of 0.3 µm or more and 1.0 µm or less, as measured according to the FSSS method, and a second fluorescent material (hereinafter also referred to as "second raw material YAG fluorescent material") having a second composition of a second rare earth aluminate and having an average particle diameter in a range of 1.1 µm or more and 10 µm or less, as measured according to the FSSS method; and calcining the molded body to obtain a sintered body.

The first raw material YAG fluorescent material and the second raw material YAG fluorescent material are subjected to neck formation (particles are bond each other) by calcining to obtain a sintered body. Since the first raw material YAG fluorescent material and the second raw material YAG fluorescent material are different in average particle diameter, the reaction rate at the time of neck formation is different, and voids are formed around the crystal phases. The rare earth aluminate sintered body contains voids dispersed around the crystal phase derived from the first raw material YAG fluorescent material and the crystal phase derived from the second raw material YAG fluorescent material having different sizes, and thus the incident light is efficiently diffused by the voids to convert the wavelength by the crystal phases adjacent to the voids. Thereby, when the rare earth aluminate sintered body is formed into a plate shape, light having high wavelength conversion efficiency and high luminous flux can be emitted from the same surface as that on which the excitation light is incident. Further, the rare earth aluminate sintered body has two kinds of crystal phases having different circle-equivalent particle diameters. Thereby, the light is irregularly reflected even between the crystal phases to convert the wavelength of the excitation light, and thus, when the wavelength-converted light is emitted from the same surface as that on which the excitation light is incident, the spread of the light is suppressed, and the emitting light converged on a desired position can be emitted.

Figure 2:
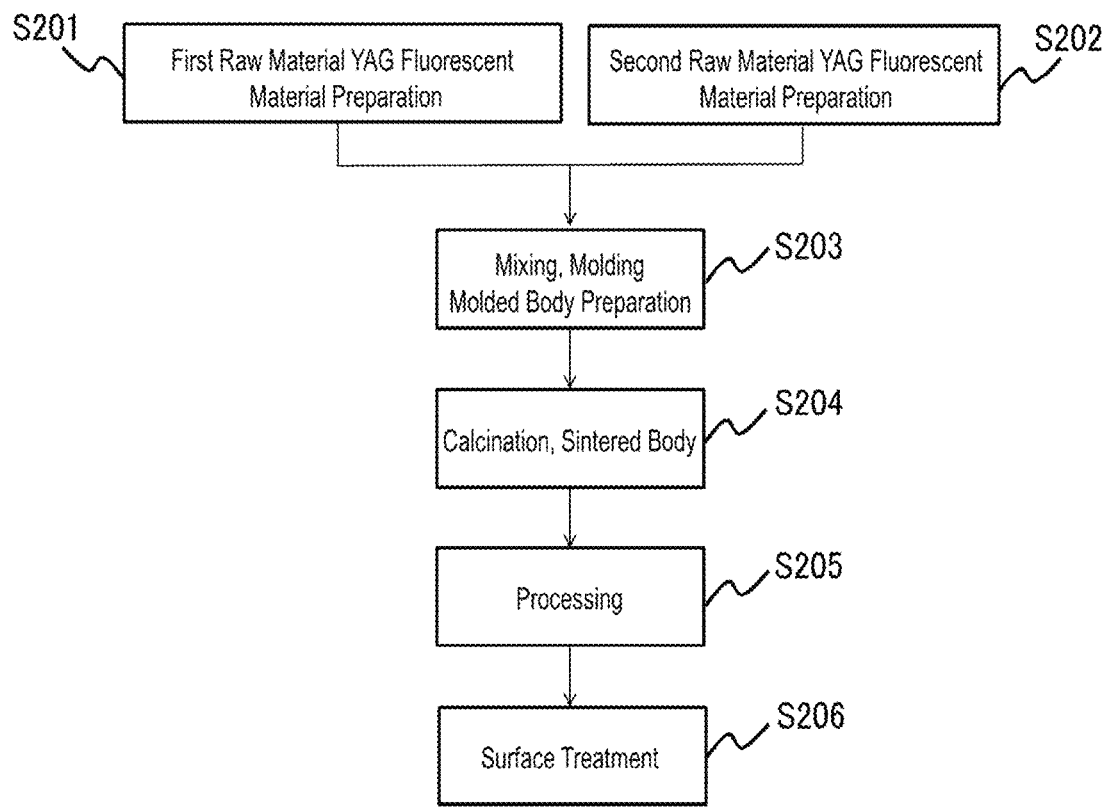
FIG. 2 is a flowchart describing a method for producing a rare earth aluminate sintered body according to the second embodiment of the present disclosure.

FIG. 2 is a flowchart describing an example of the method for producing a rare earth aluminate sintered body according to the second embodiment. The steps of the method for producing a rare earth aluminate sintered body according to the second embodiment will be described with reference to FIG. 2. The method for producing a rare earth aluminate sintered body includes a step S203 of preparing a molded body by mixing a first raw material YAG fluorescent material and a second raw material YAG fluorescent material, and a step S204 of calcining the molded body to obtain a sintered body. The method for producing a rare earth aluminate sintered body may include a step S201 of preparing a first raw material YAG fluorescent material and a step S202 of preparing a second raw material YAG fluorescent material prior to the step S203 of preparing a molded body. After the step S204 of obtaining a sintered body, the method for producing a rare earth aluminate sintered body according to the second embodiment may include a step S205 of processing the resulting sintered body by cutting into a desired size or thickness, and may further include a step S206 of subjecting the sintered body to a surface treatment.

First Raw Material YAG Fluorescent Material

The first raw material YAG fluorescent material having an average particle diameter, as measured according to the FSSS method, in a range of 0.3 µm or more and 1.0 µm or less is preferably a fluorescent material having a composition of a rare earth aluminate, which is formed by a coprecipitation method. When the YAG fluorescent material is formed by the coprecipitation method, a YAG fluorescent material having a relatively small average particle diameter can be obtained. Further, it is presumed that the YAG fluorescent material formed by the coprecipitation method has a different reaction rate at the time of calcining from that of the YAG fluorescent material formed by the dry method depending on the difference in the forming method, and voids having a relatively small circle-equivalent pore diameter are readily formed around the crystal phases.

As a method for forming the YAG fluorescent material by the coprecipitation method, for example, oxides containing a constituent element contained in the composition of the rare earth aluminate or compounds capable of being readily oxidized at high temperature are prepared as raw materials, and each compound is weighed so as to have the composition of the rare earth aluminate while considering the stoichiometric ratio. Each compound that is weighed so as to have the composition of the rare earth aluminate is dissolved in a liquid, and a precipitant is introduced in the solution to be coprecipitated to obtain a coprecipitated product. The oxide obtained by calcining the coprecipitated product, and optionally other raw materials, for example, the oxide contained in the composition of the rare earth aluminate are weighed, and the raw materials are mixed by a wet method or a dry method. A flux may be added to the raw materials. By calcining a mixture containing the oxide obtained by coprecipitation, other raw materials, and optionally a flux, a YAG fluorescent material formed by the coprecipitation method can be obtained. Examples of the compound capable of being readily oxidized at high temperature may include a hydroxide, an oxalate, a carbonate, a chloride, a nitrate, and a sulfate containing an element constituting the composition of the rare earth aluminate. The compound capable of being readily oxidized at high temperature may be a metal made of an element constituting the composition of the rare earth aluminate, for example, an aluminum metal. As the oxide, an oxide similar to that used for the aforementioned raw material mixture can be used. Examples of the liquid for dissolving the metal or each compound may include deionized water. Examples of the precipitant may include an oxalic acid or oxalate, a carbonate, and an ammonium hydrogen carbonate. Examples of the oxalate may include an ammonium oxalate, and examples of the carbonate may include an ammonium carbonate.

Second Raw Material YAG Fluorescent Material

The method for producing the second raw material YAG fluorescent material having an average particle diameter, as measured according to the FSSS method, in a range of 1.1 µm or more and 10 µm or less is not limited as long as the average particle diameter falls within the aforementioned range. As the second raw material YAG fluorescent material, a fluorescent material having a composition of a rare earth aluminate, which is formed by the aforementioned coprecipitation method or the other method, can be used.

Mass Ratio of First Raw Material YAG Fluorescent Material

In the step of mixing and molding the first raw material YAG fluorescent material and the second raw material YAG fluorescent material to obtain a molded body, the mass ratio of the first raw material YAG fluorescent material in the molded body is preferably in a range of 10% by mass or more and 90% by mass or less, more preferably in a range of 20% by mass or more and 80% by mass or less, even more preferably in a range of 30% by mass or more and 70% by mass or less, relative to 100% by mass of the total amount of the first raw material YAG fluorescent material and the second raw material YAG fluorescent material. When the mass ratio of the first raw material YAG fluorescent material falls within a range of 10% by mass or more and 90% by mass or less relative to 100% by mass of the total amount of the first raw material YAG fluorescent material and the second raw material YAG fluorescent material, two crystal phases having different sizes, that is, a first crystal phase having a circle-equivalent particle diameter in a range of 0.1 µm or more and 1.0 µm or less and a second crystal phase having a circle-equivalent particle diameter in a range of 1.1 µm or more and 15 µm or less are generated, and a sintered body in which voids are formed around the crystal phases due to a difference in growth rate of the crystal phases can be obtained.

Preparation of Molded Body

As a method for forming a molded body by mixing the raw material YAG fluorescent material and the raw material mixture containing oxides, or a method for forming a molded body by mixing the first raw material YAG fluorescent material and the second raw material YAG fluorescent material, a known method such as a press molding method can be employed. Examples of the press molding method may include a die press molding method and a cold isostatic pressing method (hereinafter also referred to as "CIP") in which the term is defined by JIS Z2500:2000, No. 2109. Alternatively, it may be molded by uniaxial compression. Two kinds of molding methods may be employed in order to form the shape of the molded body. For example, the CIP may be performed after the die press molding, or the CIP may be performed after the uniaxial compression by a roller bench method. In the CIP, the molded body is preferably pressed by a cold hydro-isostatic pressing method using water as a medium.

The pressure at the time of die press molding or molding by the uniaxial compression is preferably in a range of 5 MPa to 50 MPa, more preferably in a range of 5 MPa to 30 MPa. When the pressure at the time of die press molding or molding by the uniaxial compression falls within the aforementioned range, the molded body can be formed into a desired shape.

The pressure in the CIP is preferably in a range of 50 MPa to 200 MPa, more preferably in a range of 50 MPa to 180 MPa. When the pressure in the CIP falls within a range of 50 MPa or more and 200 MPa or less, a molded body which can be a rare earth aluminate sintered body having a relative density of 90% or more and a voidage in a range of 1% or more and 10% or less by calcination can be formed.

Calcination

The sintered body is obtained by calcining a molded body. The molded body is preferably calcined under an oxygen-containing atmosphere. The content of oxygen in the atmosphere is preferably 5% by volume or more, more preferably 10% by volume or more, even more preferably 15% by volume or more, and the atmosphere may be an air (the oxygen content is 20% by volume or more) atmosphere. In the atmosphere not containing oxygen in which the content of oxygen in the atmosphere is less than 1% by volume, the surface of oxides is hardly dissolved, and a crystal structure having a composition of the rare earth aluminate is hardly formed by dissolving the oxides, so that it may be difficult to obtain a sintered body having voids. The amount of oxygen in the atmosphere may be measured, for example, by an amount of oxygen flowing into the calcining apparatus, and may be measured at a temperature of 20° C. and a pressure of atmospheric pressure (0.101325 MPa).

The calcining temperature is preferably in a range of 1,200° C. or more and less than 1,800° C., more preferably in a range of 1,400° C. or more and 1,790° C. or less, even more preferably in a range of 1,600° C. or more and 1,780° C. or less. When the temperature at which the molded body is calcined is 1,200° C. or more, a sintered body having voids dispersed around the crystal phases due to a difference in growth rate between the crystal phases can be obtained. When the temperature at which the molded body is calcined is less than 1,800° C., a sintered body containing voids dispersed around the crystal phases, in which the grain boundaries of the crystal phases can be distinguished, in the cross section of the rare earth aluminate sintered body without being dissolved so as not to be eliminated can be obtained.

The resulting sintered body may be subjected to an annealing treatment under a reducing atmosphere. By subjecting the resulting sintered body to an annealing treatment under a reducing atmosphere, cerium which is an oxidized activation element contained in the crystal phase in the sintered body is reduced, and a decrease in wavelength conversion efficiency and a decrease in luminous efficiency can be suppressed in each crystal phase. The reducing atmosphere may be an atmosphere containing at least one rare gas selected from the group consisting of helium, neon, and argon, or a nitrogen gas, and a hydrogen gas or a carbon monoxide gas; and it is preferred that at least argon or a nitrogen gas, and a hydrogen gas or a carbon monoxide gas are contained in the atmosphere.

The temperature in the annealing treatment may be a temperature lower than the calcining temperature, and is preferably in a range of 1,000° C. or more and 1,600° C. or less. The temperature in the annealing treatment is more preferably in a range of 1,000° C. or more and 1,600° C. or less, even more preferably in a range of 1,100° C. or more and 1,400° C. or less. When the temperature in the annealing treatment is a temperature lower than the calcining temperature and falls within a range of 1,000° C. or more and 1,600° C. or less, cerium which is an oxidized activation element contained in the crystal phase in the sintered body is reduced without lowering the voidage in the sintered body, and a decrease in wavelength conversion efficiency and a decrease in luminous efficiency can be suppressed.

Processing Step

The resulting sintered body may be processed to be cut into a desired size or thickness. A known method can be used for the cutting method, and examples thereof may include blade dicing, laser dicing, and a cutting method using a wire saw. Among them, wire sawing is preferred since the cut surface becomes flat with high accuracy.

Surface Treatment Step

The surface treatment step described below may be further added. The surface treatment step is a step of subjecting the surface of the resulting rare earth aluminate sintered body or a cut product obtained by cutting the rare earth aluminate sintered body to a surface treatment. By the surface treatment step, the surface of the rare earth aluminate sintered body can be brought into an appropriate state in order to improve the light emission characteristics of the rare earth aluminate sintered body, and the rare earth aluminate sintered body can be formed into a desired shape, size, or thickness in combination with the aforementioned processing step or by the surface treatment step alone. The surface treatment step may be performed prior to the processing step of processing the rare earth aluminate sintered body by cutting into a desired size or thickness, or may be performed after the processing step. Examples of the surface treatment method may include a method using sand-blasting, a method using mechanical grinding, a method using dicing, and a method using chemical etching.

The crystal phase contained in each of the raw material YAG fluorescent materials including the first raw material YAG fluorescent material and the second raw material YAG fluorescent material, and the rare earth aluminate sintered body has a composition of a rare earth aluminate. The rare earth aluminate preferably has a composition containing at least one rare earth element Ln selected from the group consisting of Y, La, Lu, Gd, and Tb; Ce; Al; and optionally at least one element $M^1$ selected from the group consisting of Ga and Sc, in which the total molar ratio of the rare earth element Ln and Ce is 3, the total molar ratio of Al and the element $M^1$ is a product of 5 and a parameter k in a range of 0.95 or more and 1.05 or less, and the molar ratio of Ce is a product of 3 and a parameter n in a range of 0.003 or more and 0.017 or less. When the raw material YAG fluorescent materials including the first raw material YAG fluorescent material and the second raw material YAG fluorescent material, and the rare earth aluminate constituting the crystal phase contained in the rare earth aluminate sintered body are each a fluorescent material having a composition of a rare earth aluminate containing Ce as an activation element, for example, a sintered body having luminous efficiency higher than that of the other wavelength conversion member containing an inorganic material other than the fluorescent material, such as a glass material, can be obtained.

At least one of the first raw material YAG fluorescent material and the second raw material YAG fluorescent material, and the crystal phase contained in the rare earth aluminate sintered body may have a composition of a rare earth aluminate having a composition represented by the formula (I) described below. It is preferred that each of the raw material YAG fluorescent materials including the first raw material YAG fluorescent material and the second raw material YAG fluorescent material, and the crystal phase contained in the rare earth aluminate sintered body has a composition of a rare earth aluminate, and the rare earth aluminate has a composition represented by the following formula (I).

$$(Ln_{1-n}Ce_n)_3(Al_{1-m}M^1_m)_{5k}O_{12} \quad (I)$$

wherein Ln represents at least one rare earth element selected from the group consisting of Y, La, Lu, Gd, and Tb, $M^1$ represents at least one element selected from the group consisting of Ga and Sc, and parameters m, n, and k satisfy $0 \le m \le 0.02$, $0.003 \le n \le 0.017$, and $0.95 \le k \le 1.05$, respectively. Here, the parameters m, n, and k in the formula (I) are each determined when the total of the molar ratio of Ln and the molar ratio of Ce based on the analysis values is defined as 3. In the present specification, the term "molar ratio" refers to the molar ratio of each element in 1 mol of the chemical composition of the fluorescent material.

In the composition represented by the formula (I), Ln is at least one rare earth element selected from the group consisting of Y, Gd, Lu, and Tb, and two or more rare earth elements may be contained. Ce is an activation element in the raw material YAG fluorescent material, the oxide growth crystal phase, and the fluorescent material growth crystal phase, and the product of the parameter n and 3 represents a molar ratio of Ce in the composition represented by the formula (I). The parameter n is preferably in a range of 0.0035 or more and 0.016 or less ($0.0035 \leq n \leq 0.016$), more preferably in a range of 0.0040 or more and 0.015 or less ($0.0040 \leq n \leq 0.015$). In the composition represented by the formula (I), the product of the parameter m and 5 represents a molar ratio of the element $M^1$. In the composition represented by the formula (I), the parameter m may be in a range of 0.00001 or more and 0.02 or less ($0.001 \times 10^{-2} \leq m \leq 0.02$), and may also be in a range of 0.00005 or more and 0.018 or less ($0.005 \times 10^{-2} \leq m \leq 0.018$), for the purpose of converting the wavelength into a desired color tone. In the composition represented by the formula (I), the product of the parameter k and 5 represents a total molar ratio of Al and the element $M^1$. The parameter k is more preferably in a range of 0.96 or more and 1.02 or less ($0.96 \leq k \leq 1.02$), even more preferably in a range of 0.97 or more and 1.01 or less ($0.97 \leq k \leq 1.01$).

Rare Earth Aluminate Sintered Body

It is preferred that the rare earth aluminate sintered body contains a crystal phase of a fluorescent material having a composition of a rare earth aluminate, and voids, and has a circle-equivalent average particle diameter of the crystal phase in a plane or a cross section in a range of 0.3 μm or more and 15 μm or less, a circle-equivalent pore diameter of the voids in a cross section in a range of 0.1 μm or more and 5 μm or less, and a relative density in a range of 85% or more and 99% or less. The rare earth aluminate sintered body is preferably obtained by the production method according to the first embodiment or the production method according to the second embodiment.

When the circle-equivalent average particle diameter of the crystal phase contained in the rare earth aluminate sintered body falls within a range of 0.3 μm or more and 15 μm or less and the circle-equivalent pore diameter of the voids falls within a range of 0.1 μm or more and 5 μm or less, the excitation light incident on the rare earth aluminate sintered body is diffused by the voids since the average size of the voids is almost the same as or smaller than that of the crystal phases. Thus, the wavelength of the light diffused by the voids is efficiently converted by the crystal phases, so that the wavelength-converted light can be efficiently emitted from the same surface as that on which the excitation light is incident.

The circle-equivalent average particle diameter of the crystal phase contained in the rare earth aluminate sintered body is measured as follows. Using a scanning electron microscope (SEM), an SEM micrograph of the rare earth aluminate sintered body in a plane or a cross section is observed; and in the SEM micrograph, the longest diameter and the shortest diameter in one crystal phase separated by the grain boundary are measured or the diameters of two or more points in one crystal phase are measured, and the average value of the longest diameter and the shortest diameter or the average value of the diameters of two or more points can be designated as the circle-equivalent particle diameter of the crystal phase. For example, circle-equivalent particle diameters of a plurality of crystal phases in the SEM micrograph of the rare earth aluminate sintered body in a plane or a cross section are measured, and the value obtained by dividing the total value of the circle-equivalent particle diameters of the crystal phases by the number of the measured crystal phases can be designated as the circle-equivalent average particle diameter of the crystal phase.

As for the circle-equivalent pore diameter of the voids contained in the rare earth aluminate sintered body, an SEM micrograph of the rare earth aluminate sintered body in a cross section is observed; and in the SEM micrograph, the longest diameter and the shortest diameter in one void are measured or the diameters of two or more points in one void are measured, and the average value of the longest diameter and the shortest diameter in one void or the average value of the diameters of two or more points in one void can be designated as the circle-equivalent pore diameter of the void.

The relative density of the rare earth aluminate sintered body is preferably in a range of 85% or more and 99% or less, more preferably 89% or more, even more preferably 90% or more, still more preferably 91% or more, particularly preferably 92% or more. When the relative density of the rare earth aluminate sintered body falls within a range of 85% or more and 99% or less, the excitation light incident on the rare earth aluminate sintered body is efficiently diffused by the voids to efficiently convert the wavelength of the diffused light by the crystal phases, and the wavelength-converted light can be emitted from the same surface as that on which the excitation light is incident.

The relative density of the rare earth aluminate sintered body can be calculated from the apparent density of the rare earth aluminate sintered body and the true density of the rare earth aluminate sintered body according to the following formula (1).

$$\text{Relative density (\%) of rare earth aluminate sintered body} = \quad (1)$$
$$(\text{Apparent density of rare earth aluminate sintered body} \div$$
$$\text{True density of rare earth aluminate sintered body}) \times 100$$

The apparent density of the rare earth aluminate sintered body is a value obtained by dividing the mass of the rare earth aluminate sintered body by the volume of the rare earth aluminate sintered body, and can be calculated according to the following formula (2). As the true density of the rare earth aluminate sintered body, the true density of a rare earth aluminate fluorescent material can be used.

$$\text{Apparent density of rare earth aluminate sintered body} = \quad (2)$$
$$\text{Mass (g) of rare earth aluminate}$$
$$\text{sintered body} \div \text{Volume (cm}^3\text{) of rare earth}$$
$$\text{aluminate sintered body (Archimedes' method)}$$

The voidage of the rare earth aluminate sintered body is preferably in a range of 1% or more and less than 15%. The voidage of the rare earth aluminate sintered body is a value obtained by subtracting the relative density of the rare earth aluminate sintered body from 100%, and can be calculated according to the following formula (3) as necessary.

$$\text{Voidage (\%) of rare earth sintered body} = 100\% -$$
$$\text{Relative density (\%) of rare earth aluminate}$$
$$\text{sintered body} \quad (3)$$

The rare earth aluminate sintered body preferably has voids dispersed around the crystal phases. When the voids are dispersed around the crystal phases, the excitation light incident on the rare earth aluminate sintered body is diffused by the voids dispersed around the crystal phases, and the wavelength of the diffused light is efficiently converted by the crystal phases, so that the wavelength-converted light can be emitted from the same surface as that on which the excitation light is incident.

The rare earth aluminate sintered body preferably contains a first crystal phase having a circle-equivalent particle diameter in a plane or a cross section in a range of 0.1 μm or more and 1.0 μm or less and a second crystal phase having a circle-equivalent particle diameter in a plane or a cross section in a range of 1.1 μm or more and 15 μm or less. When the rare earth aluminate sintered body has two kinds of crystal phases having different circle-equivalent particle diameters, the light is irregularly reflected even at the interface between the first crystal phase and the second crystal phase having different sizes to convert the wavelength of the excitation light. Thus, when the wavelength-converted light is emitted from the same surface as that on which the excitation light is incident, the spread of the light is suppressed, and the wavelength-converted light converged on a desired position can be emitted.

The first crystal phase and the second crystal phase contained in the rare earth aluminate sintered body tend to form voids when there is a difference in the size of the crystal phases. In addition, when the voids are too large, the excitation light may be transmitted without being diffused by the voids. When the circle-equivalent particle diameter of the first crystal phase falls within a range of 0.1 μm or more and 1.0 μm or less and the circle-equivalent particle diameter of the second crystal phase falls within a range of 1.1 μm or more and 15 μm or less, voids having a circle-equivalent pore diameter in a range of 0.1 μm or more and 5.0 μm or less are present around the crystal phases, and the excitation light is efficiently diffused by the voids having an appropriate size to efficiently convert the wavelength by the crystal phases, so that the wavelength-converted light converged on a desired position can be emitted from the same surface as that on which the excitation light is incident.

The rare earth aluminate sintered body preferably has an average number of voids per unit area 645 μm$^2$ in a cross section in a range of 5 or more and 30 or less. When the number of voids contained in the rare earth aluminate sintered body falls within a range of 5 or more and 30 or less per unit area in a cross section, the voids are almost uniformly contained in the rare earth aluminate sintered body, and the excitation light is efficiently diffused by the voids to efficiently convert the wavelength by the surrounding crystal phases, so that the luminous efficiency of the rare earth aluminate sintered body can be enhanced. The number of voids per unit area 645 μm$^2$ in a cross section of the rare earth aluminate sintered body may be in a range of 6 or more and 28 or less, may be in a range of 8 or more and 25 or less, and may be in a range of 10 or more and 25 or less.

The number of voids per unit area contained in the rare earth aluminate sintered body can be determined as follows: an SEM micrograph of an arbitrary cross section of the rare earth aluminate sintered body is observed using an SEM; one SEM micrograph is divided into four parts; the number of voids per unit area 645 μm$^2$ of each divided part is measured; and the number of the voids per each unit area is summed to be divided by the number of the measured unit area, which is 4 in this case, thereby calculating the average number of voids per unit area. For example, the average number of voids per unit area in a cross section of the rare earth aluminate sintered body can be determined by observing an arbitrary five places in the cross section of the rare earth aluminate sintered body in the SEM micrograph; dividing each of the five places into four parts and defining an area of 645 μm$^2$ in each place as a unit area; and dividing the total number of the voids contained in the 20 unit areas 645 μm$^2$, which are obtained by dividing each of the five SEM micrographs into four parts, by the number of the measured unit area, which is 20.

The rare earth aluminate sintered body can be used as a reflection-type wavelength conversion member, in which the incident surface (first main surface) on which the excitation light is incident and the emitting surface (first main surface) from which the wavelength-converted light is emitted are the same. When the rare earth aluminate sintered body is used as a reflection-type wavelength conversion member in which the incident surface of the excitation light and the light emitting surface are the same, the thickness thereof is not limited, and when the rare earth aluminate sintered body is a plate-shaped body, the plate thickness is preferably in a range of 90 μm or more and 250 μm or less, more preferably in a range of 100 μm or more and 240 μm or less.

As for the rare earth aluminate sintered body formed into a plate shape, in the case where the incident surface on which the excitation light is incident and the emitting surface from which the light is emitted are the same, the light diameter of the emitting light is preferably less than 100%, more preferably 95% or less, even more preferably 94% or less, when the light diameter of the incident light is defined as 100%. When the light diameter of the emitting light emitted from the same surface as the incident surface is less than 100% relative to 100% of the light diameter of the incident light, the spread of the emitting light is suppressed, and the light emitted from the rare earth aluminate sintered body can be converged on a desired position. The light diameter of the incident light that is incident on one surface of the rare earth aluminate sintered body is a light diameter of light emitted from a light source. The light diameter of the incident light can be measured, for example, with a color luminance meter. The light diameter of the incident light is preferably in a range of 1 mm or more and 5 mm or less, more preferably in a range of 2 mm or more and 4 mm or less. The light diameter of the emitting light emitted from the same surface as that on which the incident light is incident in the rare earth aluminate sintered body can be measured as follows: light emission luminance of the light emitted from the rare earth aluminate sintered body is measured with a color luminance meter; a position exhibiting the maximum luminance in the obtained light emission spectrum is defined as a center (measuring center); distances (mm) of two positions where the luminance becomes one-hundredth of the maximum luminance in the light emission spectrum (hereinafter referred to as "one-hundredth luminance" in some cases) from the measuring center are each measured in terms of an absolute value; and the sum of the absolute values of the distances (mm) of the two positions where the luminance becomes one-hundredth of the maximum luminance in the light emission spectrum from the measuring center is determined as the light diameter of the emitting light.

The obtained rare earth aluminate sintered body can be used in a light emitting device such as a light source for a projector as a light conversion member by being combined with a light source.

Light Emitting Device

The light emitting device includes the rare earth aluminate sintered body and an excitation light source.

The excitation light source is preferably a semiconductor light emitting element comprising an LED chip or an LD chip. As the semiconductor light emitting element, a nitride-based semiconductor (In$_X$Al$_Y$Ga$_{1-X-Y}$N, 0≤X, 0≤Y, X+Y≤1) can be used. By using the semiconductor light emitting element as the excitation light source, a stable light emitting device which is high in linearity of an output against an input with high efficiency and strong against a mechanical impact can be obtained. The rare earth aluminate sintered body converts the wavelength of light emitted from the nitride-based semiconductor light emitting element, and is able to constitute a light emitting device that emits wavelength-converted mixed color light. The nitride-based semiconductor light emitting element preferably emits light in a wavelength range of, for example, 350 nm or more and 500 nm or less. The rare earth aluminate sintered body preferably converts the wavelength of excitation light emitted from the nitride-based semiconductor light emitting element to emit emitting light having a light emission peak wavelength in a range of 500 nm or more and less than 650 nm.

The excitation light source is more preferably a semiconductor laser. Excitation light emitted from the semiconductor laser as the excitation light source is incident on the rare earth aluminate sintered body to be used as the wavelength conversion member; the light of which the wavelength is converted by the rare earth aluminate sintered body is converged and separated into red light, green light, and blue light by plural optical systems, such as a lens array, a deflection conversion element, and a color separation optical system; and the lights may be modulated according to image information to thereby form color image lights. The excitation light emitted from the semiconductor laser as the excitation light source may be incident on the rare earth aluminate sintered body through an optical system such as a dichroic mirror or a collimating optical system.

Figure 3:
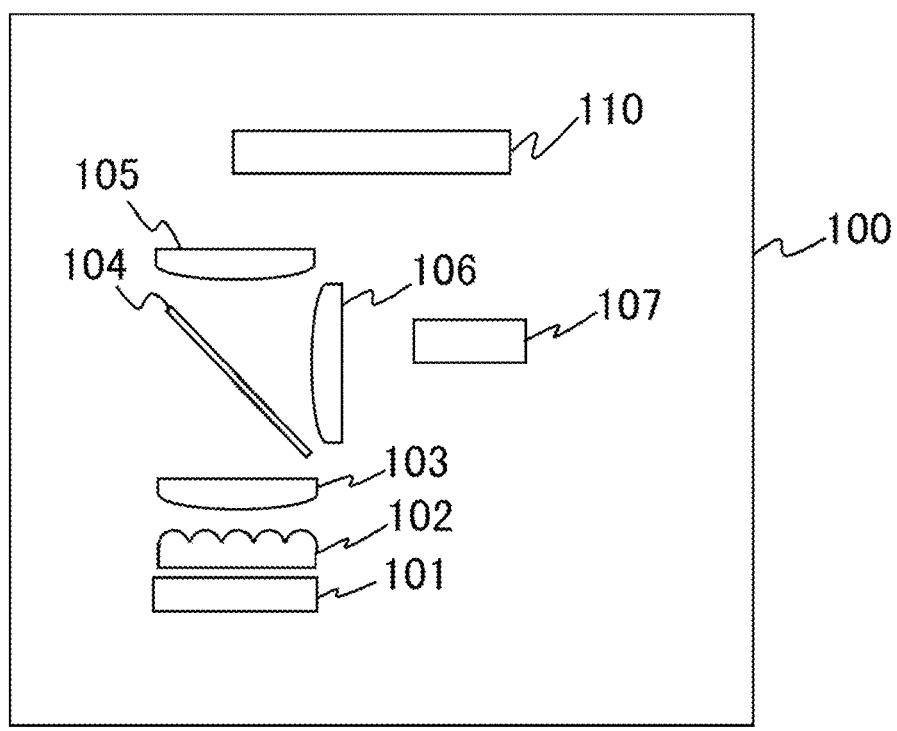
FIG. 3 is a diagram illustrating a schematic configuration showing an example of a light emitting device.

FIG. 3 is a diagram illustrating a schematic configuration showing an example of a light emitting device 100. The light emitting device 100 preferably includes an excitation light source 101, a collimating lens 102, three condenser lenses 103, 105, and 106, a dichroic mirror 104, a rod integrator 107, and a fluorescent material device 110 containing a rare earth aluminate sintered body. As the excitation light source 101, a semiconductor laser is preferably used. As the excitation light source 101, a plurality of semiconductor lasers may be used, or one in which a plurality of semiconductor lasers are arranged in an array or a matrix may be used. The collimating lens 102 may be a collimating lens array in which a plurality of collimating lenses is arranged in an array. The laser light emitted from the excitation light source 101 is converted to substantially parallel light by the collimating lens 102, is converged by the condenser lens 103, passes through the dichroic mirror 104, and is further converged by the condenser lens 105. The wavelength of the laser light converged by the condenser lens 105 is converted by the fluorescent material device 110 containing a rare earth aluminate sintered body, and light having a light emission peak wavelength in a desired wavelength range is emitted from the fluorescent material device 110. The wavelength-converted light emitted from the fluorescent material device 110 is converged by the condenser lens 106, and is incident on the rod integrator 107. Then, light having illuminance distribution with enhanced uniformity in a region to be illuminated is emitted from the light emitting device 100. The light emitting device 100 containing a rare earth aluminate sintered body can be used in a light source for a projector.

Figure 4:
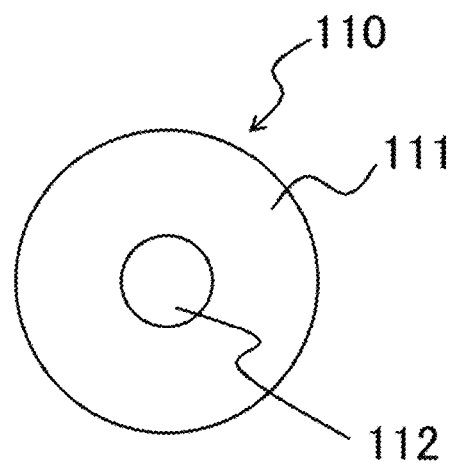
FIG. 4 is a plan view illustrating a schematic configuration of an example of a fluorescent material device containing a rare earth aluminate sintered body.

FIG. 4 is a plan view illustrating a schematic configuration of an example of a fluorescent material device 110. The fluorescent material device 110 includes at least a rare earth aluminate sintered body 111. The fluorescent material device 110 includes a rare earth aluminate sintered body 111 in a disc-shaped, and may include a rotation mechanism 112 for rotating the rare earth aluminate sintered body 111. The rotation mechanism 112 is connected to a drive mechanism such as a motor, and is able to radiate heat by rotating the rare earth aluminate sintered body 111.

Figure 5:
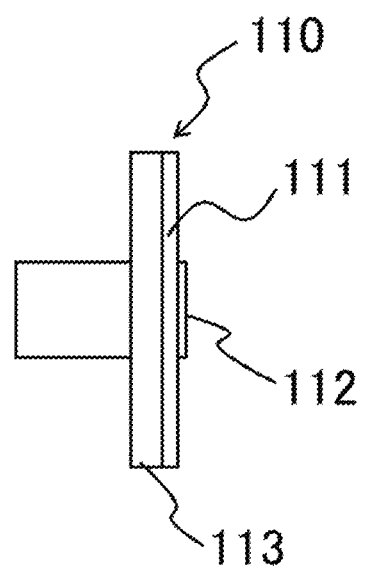
FIG. 5 is a side view illustrating a schematic configuration of an example of the fluorescent material device.

FIG. 5 is a side view illustrating a schematic configuration of an example of the fluorescent material device 110. The fluorescent material device 110 may include a heat radiator 113 in contact with the rare earth aluminate sintered body 111. In the fluorescent material device 110, the rare earth aluminate sintered body 111 can be rotated by the rotation mechanism 112 to radiate heat, and the heat generated in the rare earth aluminate sintered body 111 can be conducted to the heat radiator 113 to easily radiate the heat from the heat radiator 113 to the outside of the fluorescent material device 110.

EXAMPLES

The present disclosure is hereunder specifically described by reference to the following Examples. The present disclosure is not limited to these Examples.

Production Example of First Raw Material YAG Fluorescent Material (YAG Fluorescent Material by Coprecipitation Method)

Yttrium chloride ($YCl_3$), cerium chloride ($CeCl_3$), and aluminum chloride ($AlCl_3$) were weighed so as to have a composition represented by $Y_{2.99}Ce_{0.01}Al_5$, and dissolved in deionized water to prepare a mixed solution. The mixed solution was introduced into a $(NH_3)_2CO_3$ solution, and a mixture represented by $(Y_{0.99}Ce_{0.01})_3Al_5$ was obtained by a coprecipitation method. The mixture was placed in an alumina crucible and calcined at a temperature in a range of 1,300° C. to 1,600° C. for 10 hours in an air atmosphere to obtain a calcined product. The resulting calcined product was passed through a dry-type sieve to undergo classification, thereby preparing a first raw material YAG fluorescent material (coprecipitated YAG fluorescent material) having a composition represented by $Y_{2.99}Ce_{0.01}Al_5O_{12}$. The average particle diameter of the first raw material YAG fluorescent material (coprecipitated YAG fluorescent material) was 0.3 μm as measured by a method described below.

Production Example of Second Raw Material YAG Fluorescent Material a

Yttrium oxide ($Y_2O_3$), cerium oxide ($CeO_2$), and aluminum oxide ($Al_2O_3$) were weighed and mixed so as to have a composition represented by $Y_{2.97}Ce_{0.03}Al_5O_{12}$, and aluminum fluoride ($AlF_3$) was added thereinto as a flux and mixed with a ball mill. The mixture was placed in an alumina crucible and calcined at a temperature in a range of 1,400° C. to 1,600° C. for 10 hours in a reducing atmosphere to obtain a calcined product. The resulting calcined product was dispersed in pure water; a solvent stream was allowed to flow while applying various vibrations through a sieve and passed through a wet-type sieve; and subsequently, the resulting product was dehydrated and dried, and then passed through a dry-type sieve to undergo classification, thereby preparing a second raw material YAG fluorescent material a having a composition represented by $Y_{2.97}Ce_{0.03}Al_5O_{12}$. The average particle diameter of the second raw material YAG fluorescent material was 1.1 μm as measured by a method described below. The resulting fluorescent material in the present production example is described as the second raw material YAG fluorescent material in Table 1.

Production Example of Second Raw Material YAG Fluorescent Material b

A second raw material YAG fluorescent material b having a composition represented by $(Y_{2.99}Ce_{0.01}Al_5O_{12}$ was prepared in the same manner as in the method for producing the second raw material YAG fluorescent material a except that yttrium oxide $(Y_2O_3)$, cerium oxide $(CeO_2)$, and aluminum oxide $(Al_2O_3)$ were weighed and mixed so as to have a composition represented by $Y_{2.99}Ce_{0.01}Al_5O_{12}$. The average particle diameter of the second raw material YAG fluorescent material b was 1.1 μm as measured by a method described below. The resulting fluorescent material in the present production example is described as the second raw material YAG fluorescent material b in Table 1.

Yttrium Oxide

Yttrium oxide particles (purity of yttrium oxide of 99.9% by mass) having an average particle diameter of 0.05 μm were used.

Aluminum Oxide

Aluminum oxide particles (purity of aluminum oxide of 99.9% by mass) having an average particle diameter of 0.6 μm were used.

Cerium Oxide

Cerium oxide particles (purity of cerium oxide of 99.9% by mass) having an average particle diameter of 0.2 μm were used.

Average Particle Diameter

As for each of the first raw material YAG fluorescent material, the second raw material YAG fluorescent material a, the second raw material YAG fluorescent material b, the yttrium oxide particles, the aluminum oxide particles, and the cerium oxide particles, using a Fisher Sub-Sieve Sizer Model 95 (manufactured by Fisher Scientific Inc.) under an environment of a temperature of 25° C. and a humidity of 70% RH, 1 cm³ of each sample (fluorescent materials and oxide raw materials) was weighed and packed in a dedicated tubular container, followed by flowing dry air at a constant pressure, and the specific surface area was read from the differential pressure to calculate the average particle diameter according to the FSSS method. The results are as described above.

Example 1

The raw material mixture was used as a first particle, the second raw material YAG fluorescent material a having an average particle diameter of 1.1 μm was used as a second particle, and these were weighed such that the total of each element contained in the first particle and the second particle was a composition represented by $Y_{2.97}Ce_{0.03}Al_5O_{12}$. The raw material mixture was obtained by weighing and mixing yttrium oxide $(Y_2O_3)$ having an average particle diameter of 0.05 μm, cerium oxide $(CeO_2)$ having an average particle diameter of 0.2 μm, and aluminum oxide $(Al_2O_3)$ having an average particle diameter of 0.6 μm, so as to have a composition represented by $Y_{2.97}Ce_{0.03}Al_5O_{12}$. The mass ratio (first/second ratio) of the raw material mixture used as a first particle to the second raw material YAG fluorescent material a used as a second particle is shown in Table 1. The raw material mixture and the second raw material YAG fluorescent material were mixed using a dry-type ball mill to prepare a mixed powder for a molded body. After removing the ball used as a mixing medium from the mixed powder, the mixed powder was filled in a die to form a cylindrical molded body having a diameter of 65 mm and a thickness of 15 mm at a pressure of 5 MPa (51 kgf/cm²). The obtained molded body was put in a packaging container, vacuum-packaged, and subjected to CIP at 176 MPa using a cold hydro-isostatic pressing apparatus (manufactured by Kobe Steel, Ltd.) to obtain a molded body. The obtained molded body was calcined in a calcining furnace (manufactured by Marusho Denki Co., Ltd.) to obtain a rare earth aluminate sintered body. The calcining conditions were as follows: an air atmosphere (0.101325 MPa, oxygen concentration of about 20% by volume), a temperature of 1,650° C., and a calcining time of 6 hours. The obtained rare earth aluminate sintered body was cut into an appropriate shape and size using a wire saw, and the surface of the cut product was then polished using a surface grinder. Finally, the rare earth aluminate sintered body of Example 1 having a plate thickness of 230 μm was obtained.

Examples 2 and 3

Rare earth aluminate sintered bodies of Examples 2 and 3 were obtained in the same manner as in Example 1 except that the raw material mixture as a first particle and the second raw material YAG fluorescent material a as a second particle were mixed at the blending ratio shown in Table 1, and the temperature at which the obtained molded body was calcined was set to the temperature shown in Table 1.

Examples 4 and 5

Rare earth aluminate sintered bodies of Examples 4 and 5 were obtained in the same manner as in Example 1 except that the raw material mixture was used as a first particle; the second raw material YAG fluorescent material b having an average particle diameter of 1.1 μm was used as a second particle; these were weighed such that the total of each element contained in the first particle and the second particle was a composition represented by $Y_{2.99}Ce_{0.01}Al_5O_{12}$; the first particle and the second particle were mixed at the blending ratio shown in Table 1; and the temperature at which the obtained molded body was calcined was set to the temperature shown in Table 1.

Example 6

A rare earth aluminate sintered body of Example 6 was obtained in the same manner as in Example 1 except that the raw material mixture was used as a first particle; the first raw material YAG fluorescent material (coprecipitated YAG fluorescent material) having an average particle diameter of 0.3 μm was used as a second particle; these were weighed such that the total of each element contained in the first particle and the second particle was a composition represented by $Y_{2.99}Ce_{0.01}Al_5O_{12}$; the first particle and the second particle were mixed at the blending ratio shown in Table 1; and the temperature at which the obtained molded body was calcined was set to the temperature shown in Table 1.

Comparative Example 1

A rare earth aluminate sintered body was obtained in the same manner as in Example 1 except that the raw material mixture was not used; the second raw material YAG fluorescent material a having an average particle diameter of 1.1 μm was used; and the temperature at which the molded body was calcined was set to the temperature shown in Table 1. The obtained rare earth aluminate sintered body was cut into an appropriate shape and size using a wire saw, and the surface of the cut product was then polished using a surface grinder. Finally, the rare earth aluminate sintered body of Comparative Example 1 having a plate thickness of 195 μm was obtained. Here, when the rare earth aluminate sintered body of Comparative Example 1 has the same plate thickness of 230 μm as in Examples 1 to 6, the light diameter ratio described below becomes large. Therefore, in the rare earth aluminate sintered body of Comparative Example 1, the plate thickness is made thinner than those of the rare earth aluminate sintered bodies of Examples 1 to 6.

Comparative Example 2

A rare earth aluminate sintered body was obtained in the same manner as in Example 1 except that the raw material mixture was used without using the first raw material YAG fluorescent material, the second raw material YAG fluorescent material a, and the second raw material YAG fluorescent material b. The obtained rare earth aluminate sintered body was cut into an appropriate shape and size using a wire saw, and the surface of the cut product was then polished using a surface grinder. Finally, the rare earth aluminate sintered body of Comparative Example 2 having a plate thickness of 230 μm was obtained.

Comparative Example 3

A rare earth aluminate sintered body was obtained in the same manner as in Example 1 except that the first raw material YAG fluorescent material (coprecipitated YAG fluorescent material) was used without using the raw material mixture, the second raw material YAG fluorescent material a, and the second raw material YAG fluorescent material b. The obtained rare earth aluminate sintered body was cut into an appropriate shape and size using a wire saw, and the surface of the cut product was then polished using a surface grinder. Finally, the rare earth aluminate sintered body of Comparative Example 3 having a plate thickness of 230 μm was obtained.

The following analyses were performed on the rare earth aluminate sintered body in each of Examples and Comparative Examples. The results are shown in Table 1 or described below.

Relative Density

The relative density of the rare earth aluminate sintered body in each of Examples and Comparative Examples was measured. The results are shown in Table 1. The relative density of the rare earth aluminate sintered body in each of Examples and Comparative Examples was calculated according to the aforementioned formula (1). The apparent density of each rare earth aluminate sintered body was calculated according to the aforementioned formula (2). As the true density of each rare earth aluminate sintered body, the true density of the YAG fluorescent material was used. The true density of each of the first raw material YAG fluorescent material (coprecipitated YAG fluorescent material), the second raw material YAG fluorescent material a, and the second raw material YAG fluorescent material b was 4.60 g/cm$^3$.

Relative Luminous Flux (%)

The rare earth aluminate sintered body in each of Examples and Comparative Examples was irradiated with laser light having a wavelength of 455 nm emitted from a laser diode such that the light diameter of the incident light was 3.5 mm, and the radiant flux of the light emitted from the same surface as that on which the laser light was incident was measured using an integral sphere. The radiant flux of Comparative Example 1 was defined as 100%, and the radiant flux obtained by measuring the sample of the rare earth aluminate sintered body of each of Examples and Comparative Examples relative to the radiant flux of Comparative Example 1 was expressed as a relative luminous flux (%).

Light Diameter Ratio (Light Diameter of Emitting Light/Light Diameter of Incident Light)

The rare earth aluminate sintered body in each of Examples and Comparative Examples was irradiated with laser light having a wavelength of 455 nm emitted from a laser diode such that the light diameter of the incident light was 3.5 mm on the first main surface on which the laser light was incident, and the light diameter of the laser light was defined as the light diameter of the incident light incident on the first main surface of the rare earth aluminate sintered body. The light diameter of the emitting light emitted from the same surface as the first main surface on which the laser light was incident was measured as follows: light emission luminance of the light emitted from the rare earth aluminate sintered body in each of Examples and Comparative Examples was measured with a color luminance meter; a position exhibiting the maximum luminance in the obtained light emission spectrum was defined as a center (measuring center); distances (mm) of two positions where the luminance became one-hundredth of the maximum luminance in the light emission spectrum (one-hundredth luminance) from the measuring center were each measured in terms of an absolute value; and the sum of the absolute values of the distances (mm) of the two positions where the luminance became one-hundredth of the maximum luminance from the measuring center was determined as the light diameter of the emitting light emitted from the first main surface. The light diameter ratio of the light diameter of the emitting light emitted from the same surface as the first main surface to the incident light incident on the first main surface was determined.

Circle-Equivalent Average Particle Diameter (μm) of Crystal Phase

Using a scanning electron microscope (SEM), an SEM micrograph of the rare earth aluminate sintered body in a plane or a cross section in each of Examples and Comparative Examples was observed; and in the SEM micrograph, the longest diameter and the shortest diameter in one crystal phase separated by the grain boundary were measured or the diameters of two or more points in one crystal phase were measured, and the average value of the longest diameter and the shortest diameter in one crystal phase or the average value of the diameters of two or more points in one crystal phase was determined as the circle-equivalent particle diameter of the crystal phase. The circle-equivalent particle diameters of 10 crystal phases as measurement targets were each measured, and the value obtained by dividing the sum of the circle-equivalent particle diameters of the crystal phases as the measurement targets by the number of the crystal phases as the measurement targets was defined as the circle-equivalent average particle diameter of the crystal phase.

Circle-Equivalent Pore Diameter (μm) of Voids

Using a scanning electron microscope (SEM), an SEM micrograph of the rare earth aluminate sintered body in a cross section in each of Examples and Comparative Examples was observed; and in the SEM micrograph, the longest diameter and the shortest diameter in one void were measured or the diameters of two or more points in one void were measured, and the average value of the longest diameter and the shortest diameter in one void or the average value of the diameters of two or more points in one void was determined as the circle-equivalent pore diameter of the void.

Number of Voids Per Unit Area

Using a scanning electron microscope (SEM), an SEM micrograph of an arbitrary cross section of the rare earth aluminate sintered body in each of Examples and Comparative Examples was observed; one SEM micrograph was divided into four parts; the number of voids per unit area 645 μm$^2$ of each divided part was measured; and the number of the voids per each unit area was summed to be divided by the number of the measured unit area, which was 4 in this case, thereby calculating the average number of the voids per unit area. The average number of voids per unit area in a cross section of the rare earth aluminate sintered body was determined by observing an arbitrary five places in the cross section of the rare earth aluminate sintered body in the SEM micrograph; dividing each of the five places into four parts and defining an area of 645 μm$^2$ in each place as a unit area; and dividing the total number of the voids contained in the 20 unit areas 645 μm$^2$, which was obtained by dividing each of the five SEM micrographs into four parts, by the number of the measured unit area, which was 20.

SEM Micrograph

Figure 6:
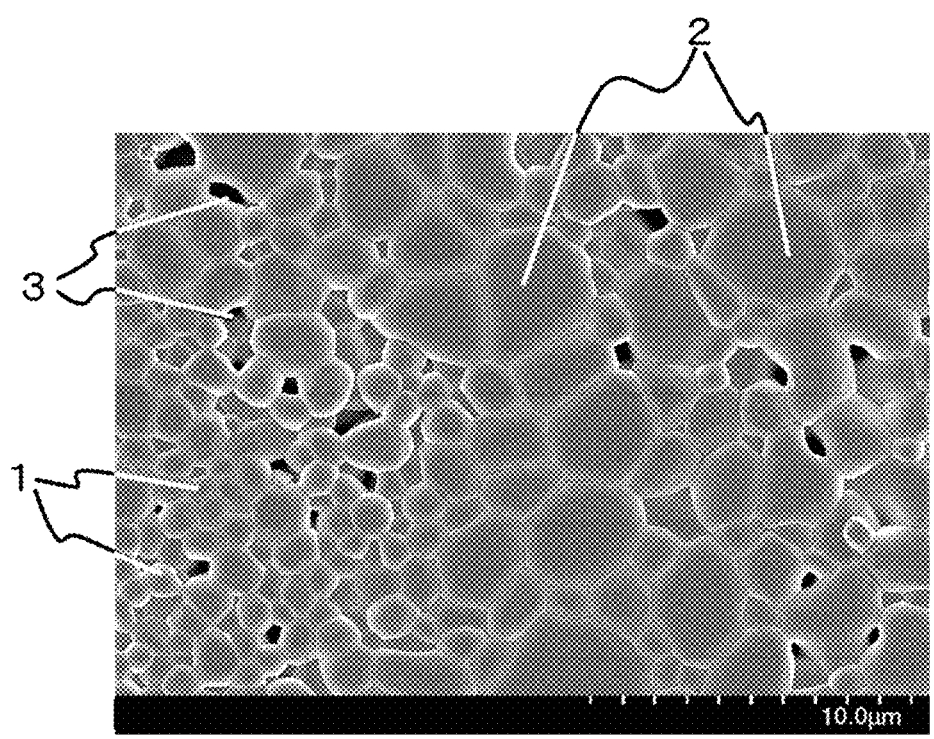
FIG. 6 is a cross-sectional scanning electron microscope (SEM) micrograph of the rare earth aluminate sintered body according to Example 1.
Figure 7:
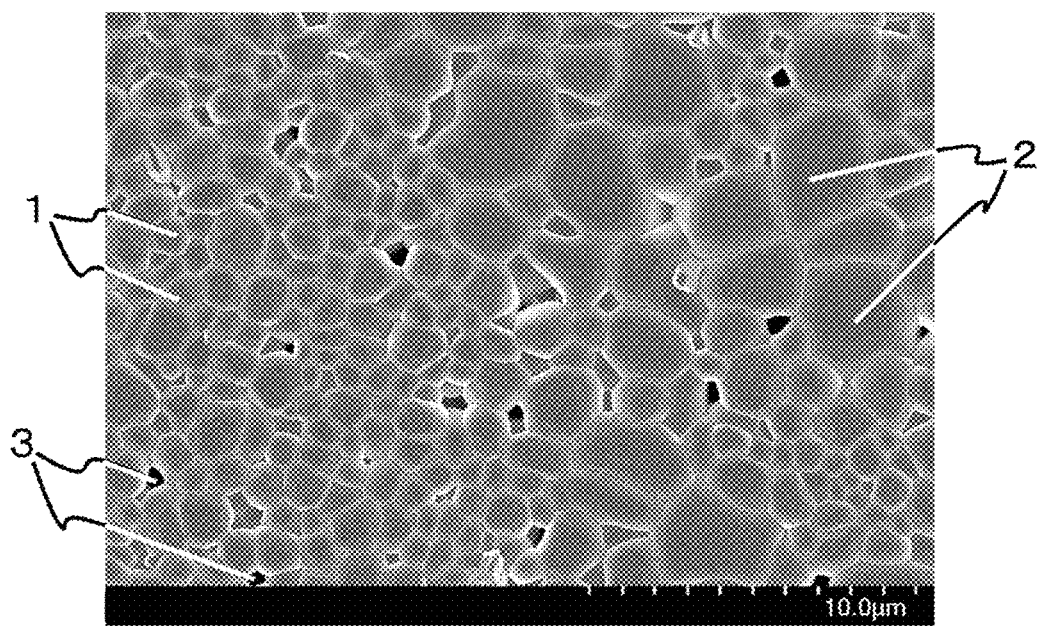
FIG. 7 is a cross-sectional SEM micrograph of the rare earth aluminate sintered body according to Example 2.
Figure 8:
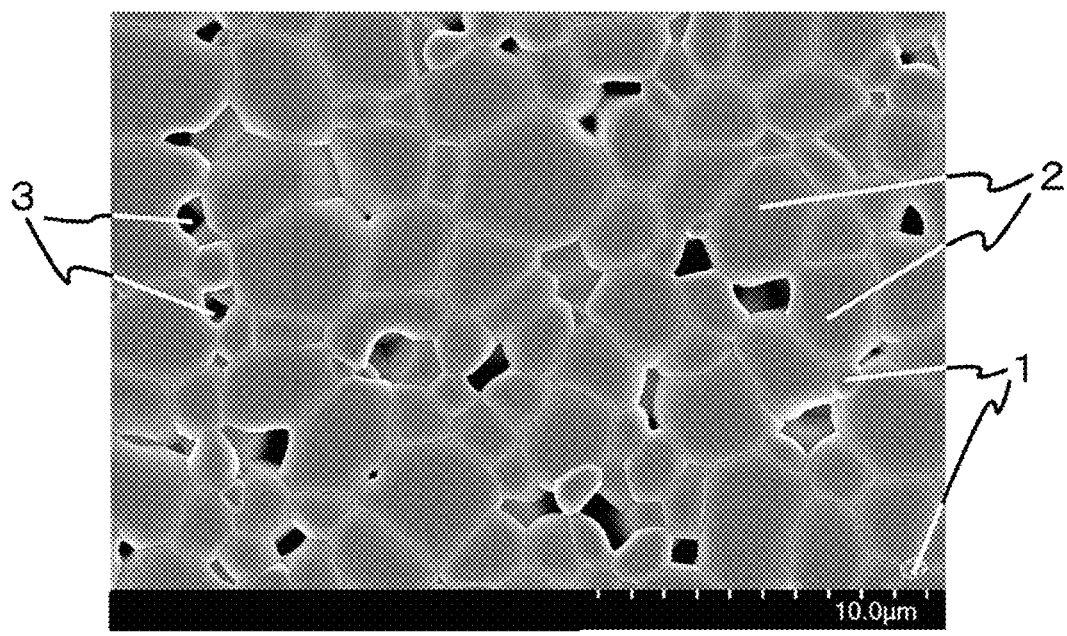
FIG. 8 is a cross-sectional SEM micrograph of the rare earth aluminate sintered body according to Example 3.
Figure 9:
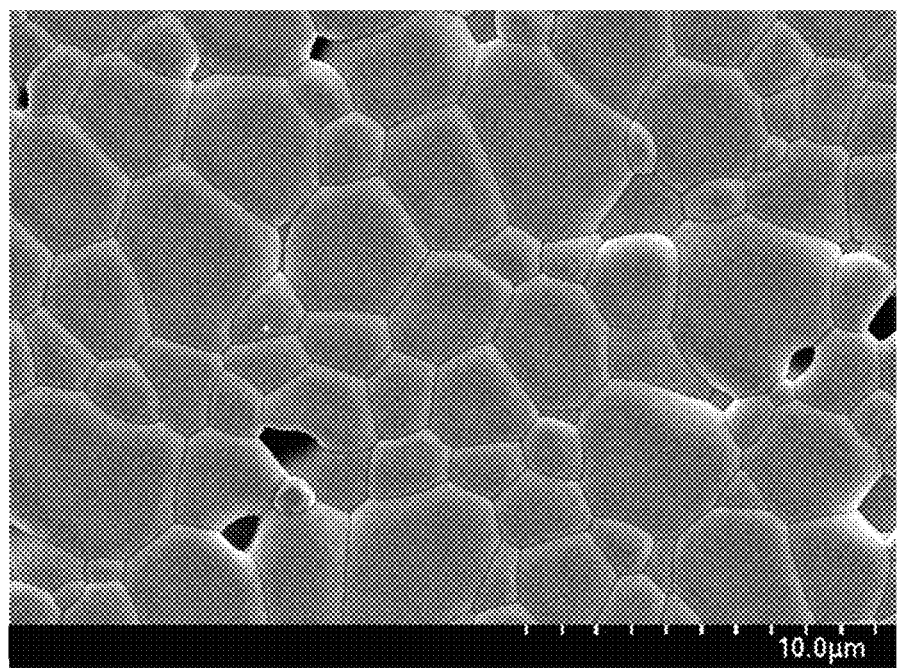
FIG. 9 is a cross-sectional SEM micrograph of the rare earth aluminate sintered body according to Comparative Example 1.
Figure 10:
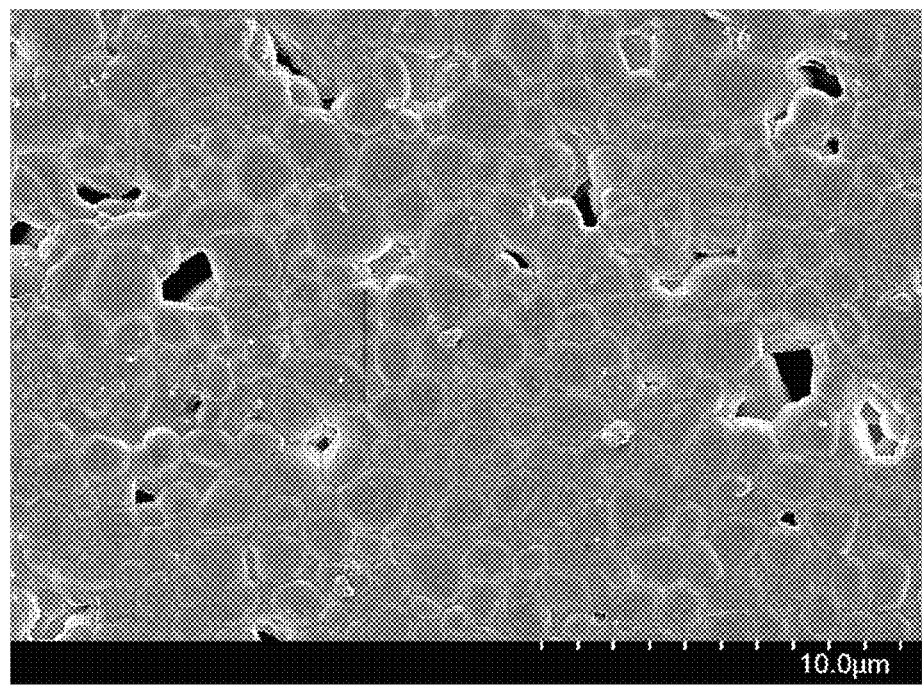
FIG. 10 is a cross-sectional SEM micrograph of the rare earth aluminate sintered body according to Comparative Example 2.

An SEM micrograph in each of Examples and Comparative Examples was obtained using a scanning electron microscope (SEM). FIGS. 6 to 8 are respectively cross-sectional SEM micrographs of the rare earth aluminate sintered bodies according to Examples 1 to 3, and FIGS. 9 and 10 are respectively cross-sectional SEM micrographs of the rare earth aluminate sintered bodies according to Comparative Examples 1 and 2.

The rare earth aluminate sintered body in each of Examples 1 to 6 had a higher relative luminous flux, a smaller light diameter ratio, and more suppressed light spread than those of the rare earth aluminate sintered body in Comparative Example 1. The rare earth aluminate sintered body in each of Examples 1 to 6 had a lower relative density than that of the rare earth aluminate sintered body in Comparative Example 1, but a higher relative luminous flux. It can be considered that this was because the voids were dispersed around the crystal phases of the sintered body, and the excitation light incident on the sintered body was efficiently diffused by the voids to efficiently convert the wavelength by the crystal phases adjacent to the voids, so that the wavelength-converted light could be emitted from the same surface as the incident surface.

The rare earth aluminate sintered body in each of Examples 4 and 5 had no significant difference in relative density and voidage as compared with the rare earth aluminate sintered body in Comparative Example 2, but the relative luminous flux was 10% or more higher than that in Comparative Example 2. Further, the rare earth aluminate sintered body in each of Examples 4 and 5 had a considerably smaller light diameter ratio compared to the rare earth aluminate sintered body in Comparative Example 2 having no large difference in relative density. From the results, it can be considered that the rare earth aluminate sintered body in each of Examples 4 and 5 had two kinds of the crystal phases, which were the first crystal phase and the second crystal phase having different circle-equivalent particle diameters in a plane, and the light was irregularly reflected between the crystal phases having different particle diameters to convert the wavelength of the excitation light, so that the spread of the light could be suppressed when the wavelength-converted light was emitted from the same surface as that on which the excitation light was incident.

The rare earth aluminate sintered body in each of Examples 1 to 6 contained the crystal phase of the fluorescent material having a composition of a rare earth aluminate, and voids; and had the first crystal phase having a circle-

TABLE 1

| | Production Conditions | | | Crystal Phase | | | | |
| --- | --- | --- | --- | --- | --- | --- | --- | --- |
| | First Particle | Second Particle | Mass Ratio First Particle/ Second Particle | Calcining Temperature (° C.) | Relative Density (%) | (Circle-Equivalent Average Particle Diameter) (μm) | Number of Voids (per Unit Area 645 μm$^2$) | Relative Luminous Flux (%) | Light Diameter Ratio Emitting Light/ Incident Light |
| Example 1 | Raw Material Mixture | Second Raw Material YAG | 50/50 | 1650 | 92.7 | 4.5 | 27.5 | 103.3 | 82.5 |
| Example 2 | | | 70/30 | | 91.8 | 4.3 | 14.0 | 103.6 | 76.0 |
| Example 3 | | Fluorescent Material a | 50/50 | 1600 | 91.1 | 6.5 | 27.0 | 104.5 | 73.6 |
| Example 4 | | Second Raw Material YAG Fluorescent Material b | 70/30 | | 93.4 | 6.1 | 6.7 | 101.2 | 92.1 |
| Example 5 | | | 50/50 | 1680 | 93.6 | 4.7 | 14.8 | 101.0 | 93.9 |
| Example 6 | | First Raw Material YAG Fluorescent Material | 70/30 | 1550 | 92.9 | 5.9 | 9.7 | 110.3 | 72.9 |
| Comparative Example 1 | Second Raw Material YAG Fluorescent Material a | — | 100 | 1675 | 93.9 | 2.3 | 12.0 | 100.0 | 100.0 |
| Comparative Example 2 | Raw Material Mixture | — | 100 | 1600 | 93.5 | 7.4 | 13.0 | 90.8 | 164.1 |
| Comparative Example 3 | First Raw Material YAG Fluorescent Material | — | 100 | 1550 | 95.8 | 4.8 | 11.7 | 94.1 | 96.8 | equivalent particle diameter in a plane in a range of 0.1 μm or more and 1.0 μm or less and the second crystal phase having a circle-equivalent particle diameter in a range of 1.1 μm or more and 15 μm or less. It is presumed that the reason why the particle diameters of the first crystal phase and the second crystal phase are different is that the crystal growth rate is different between the oxide growth crystal phase formed by crystal growth of the oxide contained in the raw material mixture and the fluorescent material growth crystal phase formed by crystal growth of the raw material YAG fluorescent material.

As for the rare earth aluminate sintered body in each of Examples 1 to 3, in the cross-sectional SEM micrographs shown in FIGS. 6 to 8, it is confirmed that the first crystal phase 1 having a circle-equivalent particle diameter in a plane in a range of 0.1 μm or more and 1.0 μm or less and the second crystal phase 2 having a circle-equivalent particle diameter in a range of 1.1 μm or more and 15 μm or less were contained. Further, in the rare earth aluminate sintered body in each of Examples 1 to 3, the voids 3 contained in the rare earth aluminate sintered body were almost uniformly dispersed around the first crystal phase and the second crystal phase. In the rare earth aluminate sintered body in each of Examples 1 to 3, the excitation light was efficiently diffused by the voids 3, and the wavelength was efficiently converted by the surrounding crystal phases, so that the relative luminous flux was increased. Further, the rare earth aluminate sintered body in each of Examples 1 to 3 contained the first crystal phase 1 and the second crystal phase 2 having different circle-equivalent particle diameters. Thus, the light was irregularly reflected even at the interface between the first crystal phase 1 and the second crystal phase 2 to convert the wavelength of the excitation light, so that the spread of the light could be suppressed when the wavelength-converted light was emitted from the same surface as that on which the excitation light was incident, and the light diameter ratio was reduced.

As for the rare earth aluminate sintered body in Comparative Example 1, in the cross-sectional SEM micrograph shown in FIG. 9, almost no first crystal phase having a circle-equivalent particle diameter of 1.0 μm or less was observed. As for the rare earth aluminate sintered body in Comparative Example 2, in the cross-sectional SEM micrograph shown in FIG. 10, no large difference was found in the particle diameter of each crystal phase. Further, the shape, size, and distribution of the voids were not uniform, and the size of the voids was relatively larger than those in Examples.

In combination with an excitation light source such as an LED or an LD, the rare earth aluminate sintered body obtained by the production method according to one embodiment of the present disclosure can be utilized as a wavelength converting member for a lighting device for in-vehicle use or general lighting, a backlight for a liquid crystal display device, or a light source for a projector.

The invention claimed is:

1. A method for producing a rare earth aluminate sintered body containing a crystal phase having a composition of a rare earth aluminate containing an oxide growth crystal phase and a fluorescent material growth crystal phase, including:
preparing a molded body by molding a fluorescent material having a composition of a rare earth aluminate and a raw material mixture consisting of an oxide containing at least one rare earth element selected from the group consisting of Y, La, Lu, Gd, and Tb, an oxide containing Ce, an oxide containing Al, and optionally an oxide containing at least one element $M^1$ selected from the group consisting of Ga and Sc; and
calcining the molded body to obtain a sintered body,
wherein an average particle diameter of the fluorescent material, as measured according to a Fisher Sub-Sieve Sizer method, is in a range of 0.3 μm or more and 10 μm or less,
wherein an average particle diameter of each of the oxide containing the at least one rare earth element, the oxide containing Ce, the oxide containing Al, and optionally the oxide containing the element $M^1$ is in a range of 0.01 μm or more and 1.5 μm or less,
wherein a temperature at which the molded body is calcined is in a range of 1,650° C. or more and less than 1,800° C., and
wherein a relative density of the rare earth aluminate sintered body is in a range of 85% or more and 93.6% or less, and the rare earth aluminate sintered body has an average number of voids per unit area 645 μm² in a cross section in a range of 5 or more and 30 or less, and
wherein the rare earth aluminate sintered body has a first crystal phase having a circle equivalent particle diameter in a plane in a range of 0.1 μm or more and 1.0 μm or less and a second crystal phase having a circle-equivalent particle diameter in arrange of 1.1 μm or more and 15 μm or less.

2. The method for producing a rare earth aluminate sintered body according to claim 1, including preparing a molded body containing the fluorescent material in a range of 10% by mass or more and 90% by mass or less relative to a total amount of the fluorescent material and the raw material mixture.

3. The method for producing a rare earth aluminate sintered body according to claim 1, wherein the rare earth aluminate comprises at least one rare earth element selected from the group consisting of Y, La, Lu, Gd, and Tb; Ce; Al; and optionally at least one element $M^1$ selected from the group consisting of Ga and Sc, wherein a total molar ratio of the at least one rare earth element and Ce is 3, a total molar ratio of Al and the element $M^1$ is a product of 5 and a parameter k in a range of 0.95 or more and 1.05 or less, and a molar ratio of Ce is a product of 3 and a parameter n in a range of 0.003 or more and 0.017 or less.

4. The method for producing a rare earth aluminate sintered body according to claim 1, wherein the rare earth aluminate is represented by the following formula (I):

$$(Ln_{1-n}Ce_n)_3(Al_{1-m}M^1_m)_{5k}O_{12} \quad (I)$$

wherein Ln represents at least one rare earth element selected from the group consisting of Y, La, Lu, Gd, and Tb, $M^1$ represents at least one element selected from the group consisting of Ga and Sc, and parameters m, n, and k satisfy 0≤m≤0.02, 0.003≤n≤0.017, and 0.95≤k≤1.05, respectively.

5. The method for producing a rare earth aluminate sintered body according to claim 1, wherein the molded body is calcined under an oxygen-containing atmosphere.

6. The method for producing a rare earth aluminate sintered body according to claim 1, wherein a temperature at which the molded body is calcined is in a range of 1,650° C. or more and less than 1,790° C.

7. The method for producing a rare earth aluminate sintered body according to claim 1, wherein the average particle diameter of the fluorescent material, as measured according to a Fisher Sub-Sieve Sizer method, is in a range of 1.1 μm or more and 10 μm or less.

* * * * *